United States Patent [19]
Williams et al.

[11] Patent Number: 5,469,072
[45] Date of Patent: Nov. 21, 1995

[54] INTEGRATED CIRCUIT TEST SYSTEM

[75] Inventors: William M. Williams; Anthony Angelo, both of Gilbert; Gregory L. Westbrook, Chandler, all of Ariz.

[73] Assignee: Motorola, Inc., Schaumburg, Ill.

[21] Appl. No.: 143,770

[22] Filed: Nov. 1, 1993

[51] Int. Cl.[6] .................................................. G01R 1/073
[52] U.S. Cl. .......................... 324/754; 324/758; 324/725; 324/73.1
[58] Field of Search ..................................... 324/758, 754, 324/22.5, 73.1

[56] References Cited

U.S. PATENT DOCUMENTS

| | | | |
|---|---|---|---|
| 4,980,637 | 12/1990 | Huff | 324/758 |
| 5,148,103 | 9/1992 | Pasiecznik, Jr. . | |
| 5,180,977 | 1/1993 | Huff | 324/754 |
| 5,264,787 | 11/1993 | Woith | 324/758 |

OTHER PUBLICATIONS

Dennis J. Genin et al., "Probing Considerations in C–4 Testing of IC Wafers," ICMCM Proceedings, 1992, pp. 124–128.

Cascade™ Microtech, 1994, "RFIC Membrane Probe" brochure.

*Primary Examiner*—Kenneth A. Wieder
*Assistant Examiner*—Mark Wardas
*Attorney, Agent, or Firm*—Joe E. Barbee

[57] ABSTRACT

An integrated circuit test system provides a quick change flexible circuit membrane (214). The flexible circuit membrane is a quadrant based design which allows steep launch angles away from a rectangular die under test (112). The flexible circuit membrane is edge guided (308,309) for positioning and concentric alignment in a probe tooling fixture (212). The system may include a focusing force member (528) focusing force only at the test point locations in line with the die pad contact positions (512) which allows greater force to be concentrated on the contact area, and helps to alleviate the debris tracking or "dust mop" effect. Additionally, a relieved area (620) may be provided on the pressure applicator (616) to prevent membrane droop or the pillowing effects.

2 Claims, 5 Drawing Sheets

INTEGRATED CIRCUIT TEST SYSTEM

BACKGROUND OF THE INVENTION

The present invention relates, in general, to integrated circuit test systems, and more particularly, to integrated circuit test systems for semiconductor die.

As pad densities increase on semiconductor die, automated testing of the die becomes increasingly difficult. The function of any interconnect system, whether a probe card, test socket or burn-in socket, is to provide a reliable interconnect between the individual die and the IC tester. In the past, traditional wafer probe cards were generally "Wire Needle Epoxy Ring" or "Ceramic Blade" styles. These probe cards have tips that touch the die pads at their needle ends to give an electrical connection via the test head pogo pins to the tester lines. These prior art methods using probe needles to contact the pads have proved insufficient for high pad density devices. The industry has turned to flexible circuit overlays having bare trace end points aligned to the pads of the semiconductor die. However, the conventional flexible membrane die probe technologies have certain failings as well.

One of these failings is that conventional membrane probe cards typically have a large surface area near the wafer during probing. This area often drapes or droops into contact with wafer areas adjacent to the die under test which causes cleanliness problems. Airborne contamination, manual handling debris and processing residue all contribute to contamination of membrane test surfaces.

Membrane probe cards dislodge wafer process particles which needle probe cards previously did not touch. These particles occur in the streets between dice or on the surface of most wafers as a result of the wafer fabrication processes. Surface contamination of membrane probe cards is a significant issue made more severe by any large membrane surface area near the wafer acting as a "dust mop" which collects dislodged particles. Membrane probe cards will collect debris from areas not directly involved in die testing, such as the process control areas of the wafer. In the past, needle probe cards were not plagued with this problem because their contact area was limited to the needle tips touching on the die contact pads.

Another problem with conventional membrane probe cards arises because they employ an elastomer to press the membrane against the wafer to provide compliance for the bumps on the membrane. The electrical traces or bumps on the membrane tend to bury themselves in the elastomer, in a phenomenon referred to as the pillow effect, as the membrane is pressed into contact with the wafer surface. The maximum load, at each of the contact points between membrane traces and die pads, becomes somewhat limited as the trace is buried below the plane of the surface of the elastomeric material. Beyond this point, only a small fraction of additional force is transferred to the connection between trace and die pads. Therefore, it is difficult to get sufficient force at the contact points of conventional membrane probe cards to make reliable electrical connections.

In addition, membrane probe cards require a connection between the membrane circuitry and the printed wiring board interfacing to the electronic tester. Conventional membrane probe cards require precise positioning of the membrane in the proper location relative to the printed circuit card. Locating the flexible membrane is difficult due to the inherent problems associated with matching multiple radial patterns. Multiple circuit connections must then be made either by wire attachment, direct bonding or compression contact. Typically, membrane probe cards are only factory repairable at considerable cost because of the precise and delicate nature of a membrane replacement.

Consequently, what is needed is an integrated circuit test system which: 1.) does not exhibit the "dust mop" effect of picking up contaminate particles, 2.) does not exhibit poor electrical connections at the wafer because of the "pillow effect", and 3.) is not difficult and expensive to repair.

DETAILED DESCRIPTION OF THE DRAWINGS

One embodiment of the present invention solves the problems associated with the commercial membrane probe cards by including the following features: 1) A quick change flexible circuit membrane; 2) A quadrant based flexible circuit membrane design which allows steep launch angles away from a rectangular die under test; 3) Edge guided flexible circuit membrane positioning for concentric flexible circuit alignment in probe tooling fixtures; 4) A method of focusing force only at the test point locations in line with the die pad contact positions; and 5) A relieved pressure applicator to prevent membrane droop or the pillowing effects.

The easily replaceable flexible circuit membrane feature is accomplished by edge guides to position the membrane. Precisely cut channels in the fixture plate locate the membrane circuit lines accurately to the conductive trace contact points on the printed wiring board. The membrane flexible circuit is designed with individual separate leaves which are compressed against the probe card printed wiring board.

The quadrant based design feature allows contact with any rectangular die at its edge and permits a steep launch angle away from the die edge. This steep angle eliminates the membrane touching down against the adjacent die surfaces. The area of the membrane near the wafer surface is reduced which will eliminate the "dust mop" effect outside the edges of the die under test.

The edge guided fixturing of the flexible circuit membrane positions the test probe points exactly on the center of the tooling fixture. Edge guiding combined with the steep launch angle, prevents the flexible circuit membrane from touching pad locations on any adjacent die.

A significant feature of this invention is the focusing of forces only at the test contact locations and the simplified method of implementing that feature. Focusing force only at the test point locations is achieved by using resilient back-up pad shaped to apply force only in line with the contact pad locations. A result of the force focusing, achieved by using a shaped resilient pad, is that the flexible circuit material can be relieved into a recessed area thereby eliminating membrane droop. Recessing the flexible circuit eliminates the "pillow" effect of a solid resilient back-up pad, thereby reducing the debris causing abrasion against the die.

One configuration of the membrane probe card assembly includes using the printed circuit card as a round disc spring to supply planarizing resilience to the overall system. The printed circuit card is a laminated disc made up of multiple layers of epoxy, fiberglass and metal circuitry usually fabricated to a defined thickness. According to this embodiment, the printed circuit card supplies a uniformly distributed spring load to planarize the complete membrane probe card assembly as it presses against the wafer. The total spring force is from the board's resistance to bending and the compressing of the plurality of pogo pins contained in the electrical tester system. These pogo pins are each individual small springs pressed against the side of the printed circuit card opposite the side where the die is tested.

The description provided herein applies to a variety of integrated circuit test environments including, for example, probe cards, bare die test sockets, and burn in sockets. The function of any interconnect system, whether a probe card, test socket or burn-in socket, is to provide a reliable interconnect between the individual die and the IC tester.

Figure 1:
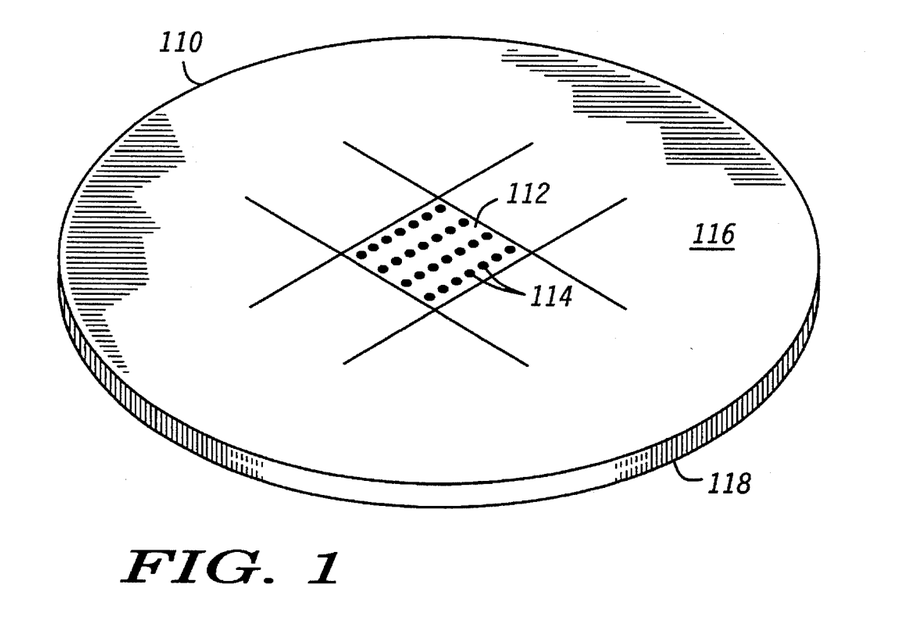
FIG. 1 is a perspective view of a semiconductor wafer comprising semiconductor die.

Turning now to the figures for a more detailed understanding, FIG. 1 is a perspective view of a semiconductor wafer comprising a plurality of semiconductor die. It should be well understood that each semiconductor die comprises integrated circuit structures formed on the die. Such integrated circuits are typically tested to insure that they work properly. The testing can be accomplished in accordance with the preferred embodiments of the present invention.

More specifically, semiconductor wafer 110 comprises a plurality of one or more semiconductor die represented by semiconductor die 112. Semiconductor die 112 includes a plurality of electrical contacts represented by contacts 114. The contacts are distributed across the surface of semiconductor die 112. The contacts may be flat pads, hemispherical shaped bumps, ball contacts such as solder balls, or a variety of other configurations, as is well known in the industry. Each of the die on semiconductor wafer 110 includes electrical contacts similar to contacts 114. Contacts are shown only on semiconductor die 112 for the purposes of simplicity and clarity. The contacts 114 are either peripherally patterned contacts which are located near the outside edges of the semiconductor die 112 or they are defined array patterned contacts which are spread across the semiconductor die surface. Semiconductor wafer 110 has two major surfaces, one surface, usually facing upward in wafer handling systems, is referred to as the integrated circuit surface 116 and the surface on the opposite side is commonly referred to as the backside surface 118.

The integrated circuit test system, in accordance with the preferred embodiment of the present invention, tests each semiconductor die on a wafer such as wafer 110 by making contact to the electrical contacts represented by contacts 114. As should be well understood by those skilled in the art, the integrated circuit test system supplies signals to the electrical contacts of the semiconductor die in order to test the operability and functionality of the semiconductor die.

Figure 2:
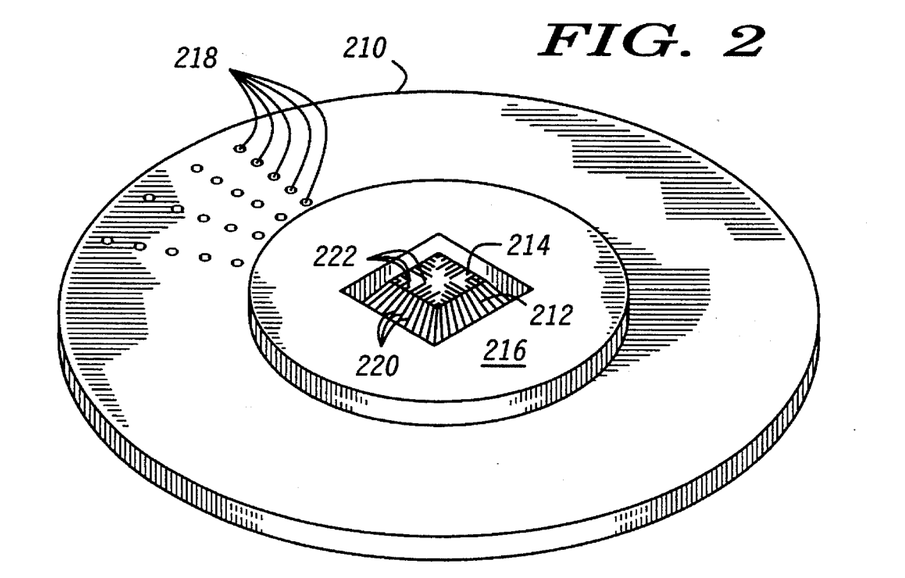
FIG. 2 is a perspective view of a printed circuit test board in accordance with a preferred embodiment of the present invention.

Turning to FIG. 2, FIG. 2 is a perspective view of the assembly of the integrated circuit test system including the printed circuit test board in accordance with the preferred embodiment of the present invention. More specifically, wafer probe test board 210 is a printed circuit board (traces not shown) with a pressure applicator 212 and flexible circuit 214 positioned at its center. Fixturing 216 represents the fixturing required to hold pressure applicator 212 and flexible circuit 214 in place at the center of board 210. Plated through-holes 218 represent plated through-holes which typically fill the perimeter of board 210.

Plated through-holes 218 provide electrical contacts for "pogo pins" which contact the through-holes from the opposite side. The pogo pins are coupled to the test head and computer of the integrated circuit test system. The plated through-holes are individually coupled to electrical traces represented by traces 220 on flexible circuit 214. The ends 222 of the traces 220 are arranged to contact the electrical contacts of the semiconductor die (e.g. contacts 114 of die 112 in FIG. 1) of a semiconductor wafer.

Accordingly, during testing, pressure applicator 212 presses flexible circuit 214 against a semiconductor die, and signals are provided to electrical contacts of the die via the pogo pins in contact with plated through-holes represented by through-holes 218.

The die contacts 114 (shown in FIG. 1), being individual pads or bumps having small variations in height, makes it desirable to include a compliant elastomeric member located between the pressure applicator 212 and the flexible circuit 214 (shown in FIG. 6 and discussed in detail below). The elastomeric member deforms by slightly different amounts at each of the localized areas surrounding the individual contact points, thereby assuring electrical contact over the irregular contact height surfaces. This leveling function is often referred to as "pad to pad" or "bump to bump" planarizing and is dependent on the pitch of the die contacts 114, the hardness and thickness of the compliant elastomeric member, the material stiffness of flexible circuit 214, and the maximum pad or bump height variations of the die contacts 114.

Referring briefly back to FIG. 1, the two major surfaces, integrated circuit surface 116 and backside surface 118, of the semiconductor wafer 110 are created by standard wafer fabrication processes including, but not limited to, saw cutting, grinding and semiconductor fabrication operations. The relationship between the integrated circuit surface 116 and backside surface 118 may be non-parallel by amounts that range up to 0.001 centimeter per centimeter of semiconductor wafer diameter. In addition to the die contact height variations accommodated by the compliant elastomeric member, small amounts of the non-parallel surface variations are designed to be absorbed by the same member.

Generally, a second method with a larger range of compliance is needed to adjust the parallelism between the plane of the surface of flexible circuit 214 and the plane of the integrated circuit surface 116 of the semiconductor wafer 110. In the preferred embodiment, the wafer probe test board 210 is used as a disc spring which deflects to adjust the surfaces to be co-planar and therefore parallel as the flexible circuit 214 is pressed against the integrated circuit surface 116 of the semiconductor wafer 110.

The board 210 is a laminated disc made up of multiple layers of epoxy, fiberglass and metal circuitry usually fabricated to a defined thickness. In this application the wafer probe test board 210 supplies a uniformly distributed spring load which adjusts the parallelism between the non-parallel surfaces to be parallel and co-planar. The total spring force supplied by board 210 is a combination of forces from the board's resistance to bending and the compressing of the plurality of pogo pins contained in the electrical tester system. The board thickness, construction materials and the size and locations of holes through the board can be defined and modified to control the total spring force. A common requirement for interconnect systems is to allow deflection beyond the point of first making full contact, this is referred to as "overtravel" Using the board 210 as a disc spring allows relatively large amounts of "overtravel" deflection in this design.

Figure 3:
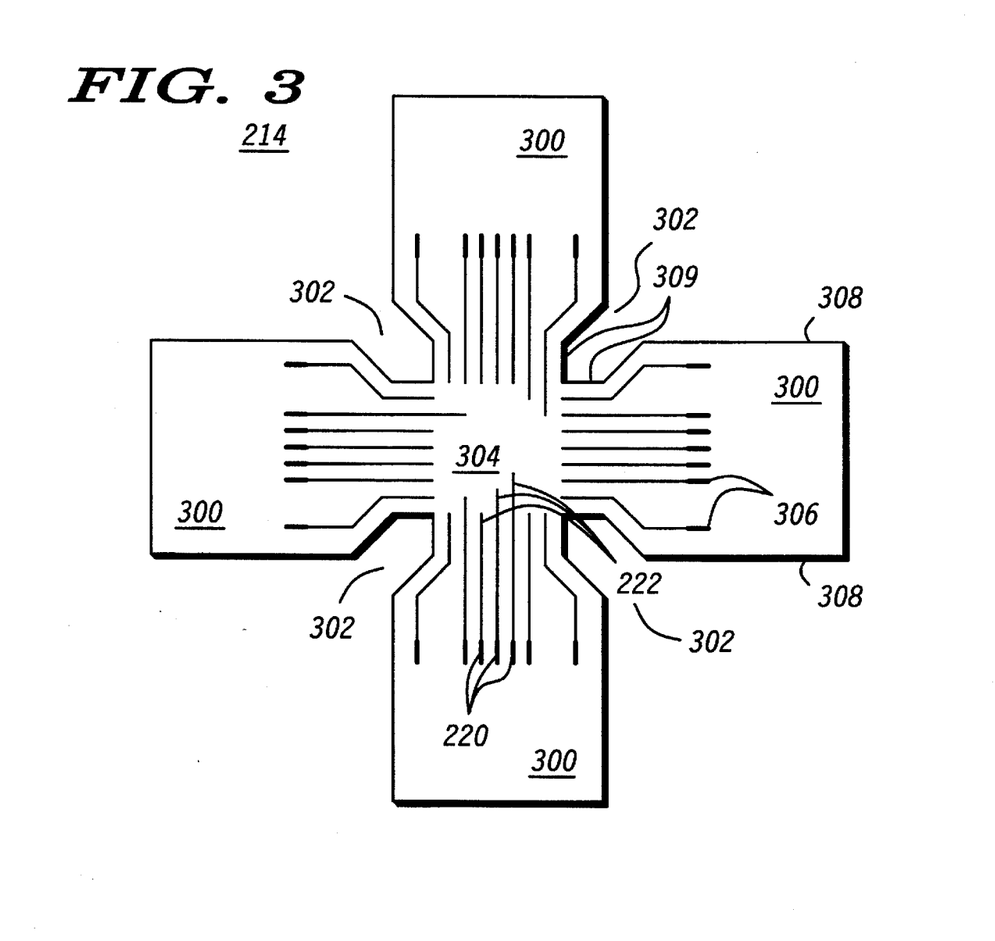
FIG. 3 is a plan view of a flexible test circuit in accordance with a preferred embodiment of the present invention.

FIG. 3 is a plan view of flexible circuit 214. Flexible circuit 214 is considered a quadrature flexible circuit because it has traces approaching from four distinct sides. In the preferred embodiment, the electrical traces represented by traces 220 are launched from four respective sides, the sides being distributed 90 degrees apart. Flexible circuit 214 comprises a plurality of leaves 300. Leaves 300 are discontinuous from one another in that there is no flexible circuit material between them in areas 302. In the preferred embodiment, the leaves do, however, meet in the center area 304. The purpose for the leaves being discontinuous in area 302 is so that the flexible circuit can be folded over pressure applicator 212, as shown in FIG. 2 and as discussed in more detail below. It should be understood that the underlying inventive concepts may be extended to other numbers of leaves, and angles separating leaves.

The traces represented by traces 220 provide external electrical contacts which correspond to the die electrical contacts represented by contacts 114 in FIG. 1. The traces represented by traces 220 have bare trace contact points 222, toward the center of the flexible circuit where the circuit leaves 300 meet. The contact points are where the traces touch the electrical contacts of the semiconductor die.

The trace contact points 222 may be flat or have raised shaped bumps as required to make electrical contact depending upon the type of die electrical contacts 114 on the semiconductor die 112 being tested. In general, bumped or ball die contacts will typically be touched with flat trace contact points, and conversely, flat die contacts will be touched with raised bumps on the contact trace points.

Flexible circuit 214 is composed of one or more metal layers and one or more dielectric film layers. Copper is frequently the choice for the conductive metal layer and polyimide is a common choice for the insulative dielectric film layers. The flexible circuit 214 may include multiple metal trace layers and multiple solid metal layers for electrical ground and power distribution. These metal layers must be separated by layers of dielectric film which may be properly sized to control electrical impedance to desired values for testing and to limit crosstalk between signal traces.

Construction of the flexible circuit is accomplished by using techniques well known to those skilled in the industry. The outline of the flexible circuit is formed by cutting operations using tight tolerances which then results in a precise width of each leaf and thereby forms edges 308 at the outer area and edges 309 near the center area. Cutting the precision outline edges can be done using techniques well known in the industry such as punching with a stamping die, cutting with a steel rule die or cutting with a high power focused laser beam. When a laser beam is used to cut the outline, common metal masking techniques may be used to protect the copper traces while slicing through the dielectric film layers. In any case, maintaining precise tolerance levels while making the cuts for the outline of the flexible circuit, particularly the areas of the widths forming the edges 308 and 309, is desirable.

As can be seen in FIG. 3, traces 220 spread out to a larger pattern at the outermost area of the leaves on the flexible circuit 214 to form bare contacts 306 at the outermost ends of traces 220. In the preferred embodiment, the bare contacts 306, oriented in straight rows, are parallel to each other to facilitate alignment to the test board contact locations. At the bare contacts 306, electrical contact is made to the test board 210 by a compression contact. The bare contacts 306 of the flexible circuit trace 220 are forced against similarly shaped contact points on the test board 210 (on the side opposite to that shown in FIG. 2). This compression contact is accomplished by using an elastomeric O-ring material to press the contacts 306 against the mating contacts on the test board 210.

Figure 4:
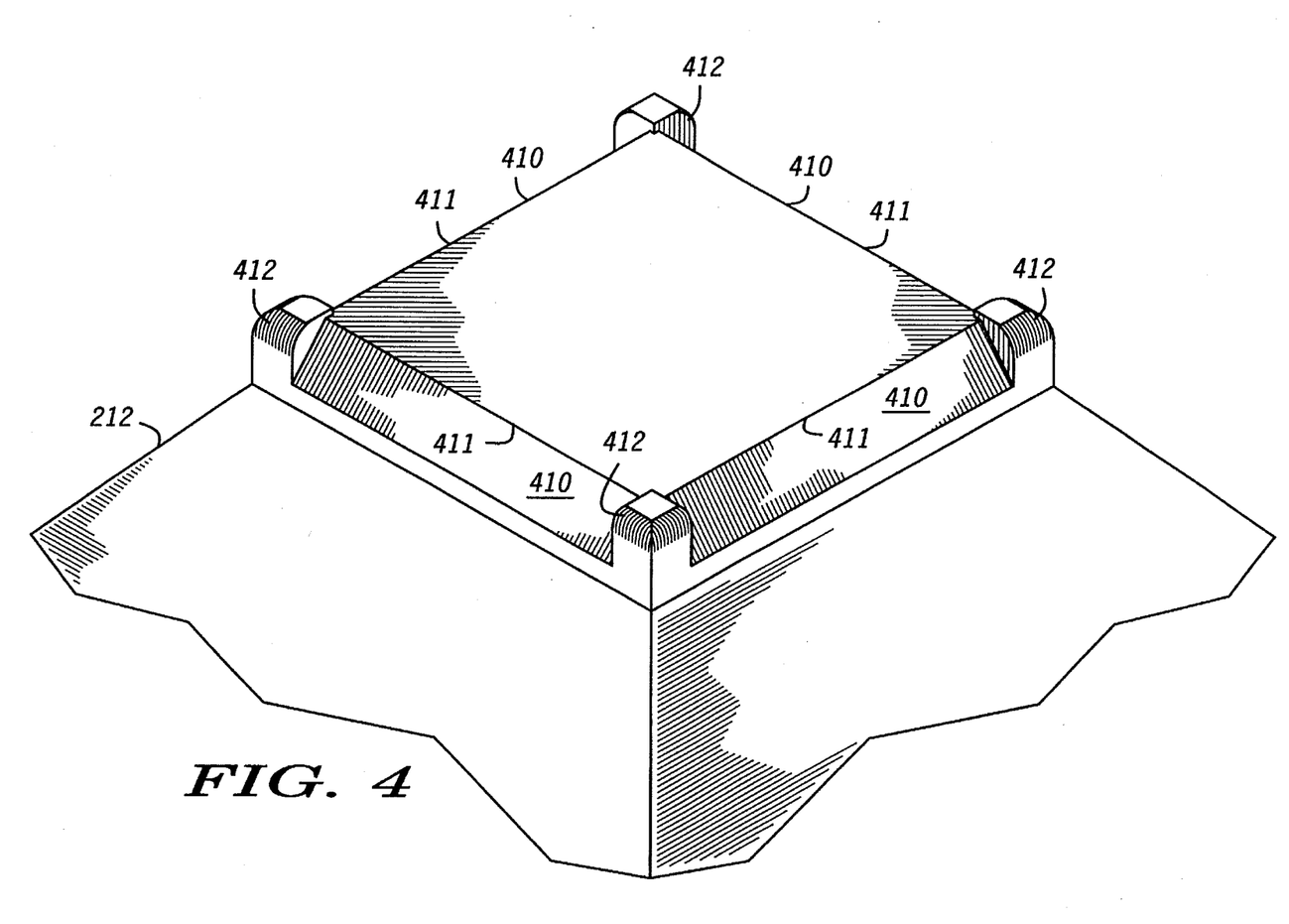
FIG. 4 is a partial perspective view of a pressure applicator in accordance with a preferred embodiment of the present invention.

FIG. 4 is an enlarged partial perspective view of pressure applicator 212. Pressure applicator 212 includes alignment channels 410 defined by corners 412. Alignment channels 410 include applicator edges 411.

Alignment channels 410 engage edges 309 of the flexible circuit 214 and align the pattern of bare trace contact points 222 to the center of the pressure applicator 212. It is desirable that the contact points are centered on the pressure applicator to prevent electrical shorting to die that are adjacent to the die under test. An alternate method of aligning flexible circuit 214 centrally on pressure applicator 212 would be to visually align the two components by including fiducial marks on the flexible circuit and the pressure applicator. In this case, the alignment channels 410 could be omitted from the pressure applicator 212.

Flexible circuit 214 is shaped over the pressure applicator 212, by forming the leaf width edges 309 into the alignment channels 410. In addition, the individual leaves 300, by using the edges 308, are threaded through precision cut channels in the fixture plate below the test board 210 to align the bare contact traces 306 of the flexible circuit 214 to the compression contact locations on the test board. Leaves 300 of the flexible circuit 214 are held in aligned location by means of the close fit between the precision cut channels in the fixture plate and the leaf edges 308 which are hidden from view below the test board 210.

The outermost ends on the leaves 300 are used as "handles" for tensioning the flexible circuit 214 over the pressure applicator 212. In the fixture plate below the test board 210, there are four clamps which hold the leaves in tension over the pressure applicator 212. Four O-ring clamps also located in the fixture plate, compress the O-ring material against contacts 306 on the flexible circuit to connect with contact traces on the test board 10.

Edge guiding the flexible circuit into the pressure applicator channels 410 and the fixture plate channels is a feature that results in the ability to quickly and accurately change to a different flexible circuit. An optional method of locating the flexible circuit to the pressure applicator includes adding pins in the pressure applicator which engage precisely located holes in the flexible circuit to set the alignment of the two components.

Figure 5:
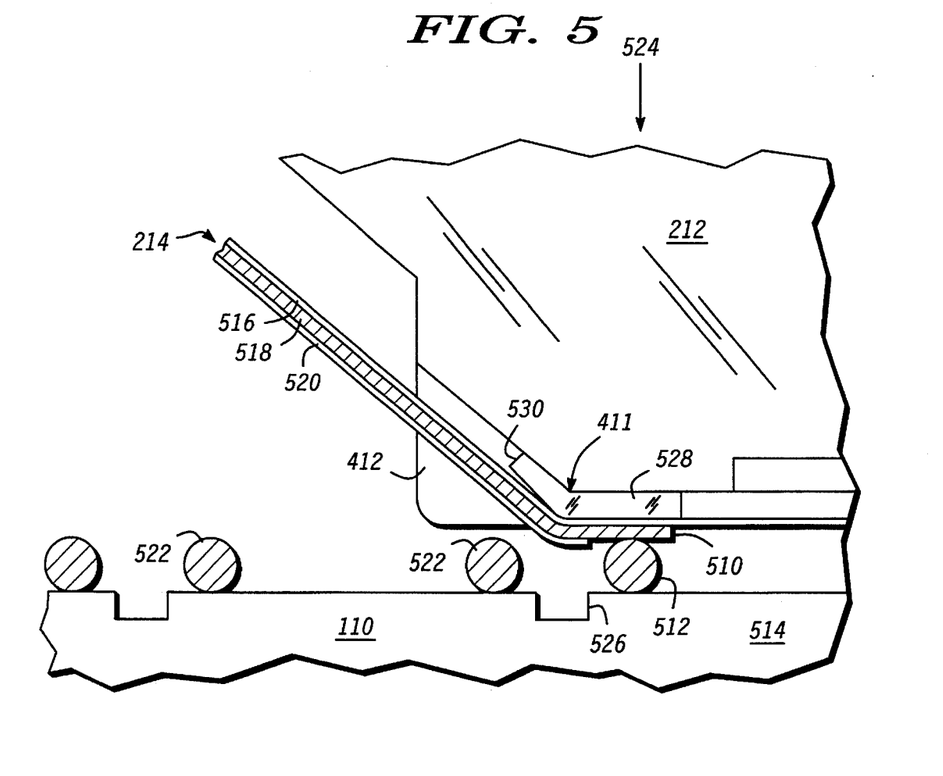
FIG. 5 is a partial side view of an integrated circuit test system in accordance with a preferred embodiment of the present invention.

FIG. 5 is a partial side view of a preferred integrated circuit test system in accordance with the present invention. FIG. 5 illustrates how the pressure applicator 212, with compliant shaped elastomeric member 528 presses a representative trace 510 of flexible circuit 214 against a representative electrical ball contact 512 on semiconductor die 514. The shaped elastomeric member 528 serves to focus the force supplied by the pressure applicator 212 at the electrical ball contact 512 location. The advantages of force focusing are discussed in detail below, with reference to FIG. 6.

In the embodiment illustrated in FIG. 5, the shaped elastomeric member 528 will be a flat rectangular shape corresponding to the test pad locations. Options for the shaped elastomeric Ember 528 include, for example, custom profiling the surface that presses against the surface of flexible circuit 214 to match the shape of the test pad locations on the flexible circuit 214. As a result of the custom profiles which may be cast, molded or machined into the surface of the shaped elastomeric member 528, force focusing is achieved on an individual contact basis. The custom profiles may include various forms such as parallel raised ripples or hemispherical bumps, for example.

Note that the enlarged view of FIG. 5 illustrates that, according to the preferred embodiment, flexible circuit 214 is multi-layered. In the embodiment shown in FIG. 5, flexible circuit 214 comprises a bottom flexible insulative layer 516, a conductive trace layer 518 and a top insulative layer 520. In alternative forms, flexible circuit 214 may be composed of one or more metal conductive trace layers and one or more dielectric film layers. In addition, flexible circuit 214 may contain multiple, continuous or partial, solid metal layers used for electrical ground and power distribution. All metal layers are separated by layers of dielectric film which may be properly sized to control electrical impedance to desired values for testing.

In FIG. 5, it can now be seen that only an end portion of exemplary trace 510 is bare in order to make contact with ball contact 512. Top insulative layer 520 remains in place over the rest of trace 510 in order to prevent undesired shorts such as a short between trace 510 and ball contact 522 which is a contact on an adjacent die which is not presently being tested.

The bare end of trace 510 may be flat or have raised shaped bumps as required to make electrical contact depending upon the type of die being tested. Bumped or ball die contacts will typically be touched with either flat trace contact points or raised bumps; and flat pad die contacts will typically be touched with raised bumps on the trace contact points.

One important feature of the preferred pressure applicator 212 combined with the compliant elastomeric member 528 is that they are transparent. Accordingly, a view of the traces and ball contacts is provided in the direction of arrow 524 in order to align traces and contacts for testing.

Another important feature of the preferred pressure applicator 212 is edges 411 aligned to the die edges. In the embodiment of FIG. 5, elastomeric member 528 is wrapped around edge 411 with an edge 530 extending into the channel 410 of FIG. 4. Alternatively the compliant elastomeric member 528 may have an edge aligned with edge 411 of the pressure applicator, rather than extending into the channel. Flexible circuit 214 is bent around the radius formed by the edge 411 of pressure applicator 212 and the thickness of the compliant elastomeric member 528. This configuration allows flexible circuit 214 to be drawn back and away from semiconductor wafer 110 in all areas except where a particular die is being tested.

The angle formed between the surface of the wafer 110 and the surface of the flexible circuit 214 as the flexible circuit is drawn back away from semiconductor wafer is referred to as the launch angle. It is preferred that flexible circuit 214 be drawn away at a steep launch angle to prevent the flexible circuit from touching ball contact 522 on the adjacent die not under test. Also, it is desirable to minimize the surface area of the flexible circuit 214 near the surface of wafer 110 to limit the "dust mop" effect.

A large flexible circuit surface area moving near the wafer surface acts as a "dust mop" to dislodge particles and collect debris. Without a steep launch angle, the flexible circuit membrane surface will also collect debris from wafer areas not probed during testing, such as the process control areas of the wafer. This debris is then often redistributed upon die areas still to be tested causing electrical opens during testing of those areas of the wafer.

The separate leaf design of the flexible circuit 214 (as shown in FIG. 3) is the feature that allows forming the flexible circuit to steep launch angles in a bend radius that is aligned to the straight die edges 526. Any launch angle greater than five degrees is considered a steep launch angle, the range of thirty degrees to sixty degrees is considered an optimum launch angle. Steep launch angles are not easily achieved with conventional radially designed membrane probe cards.

Figure 6:
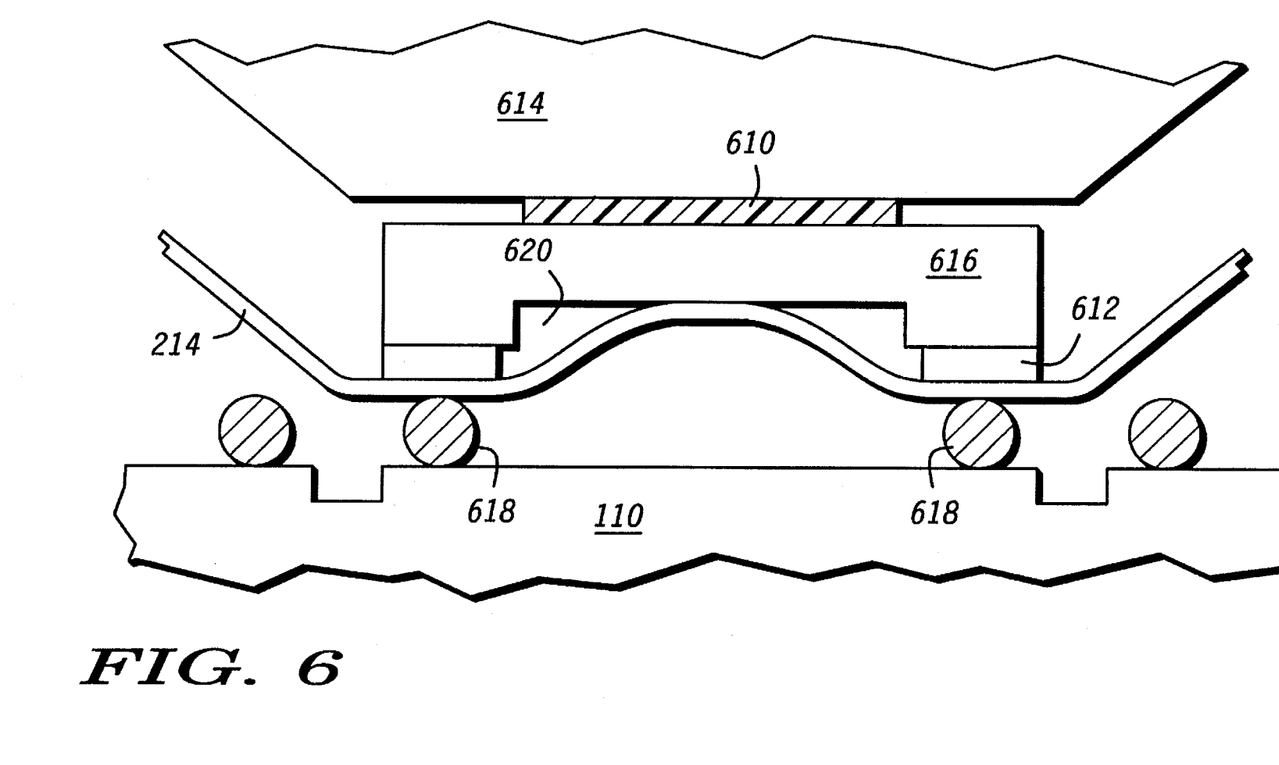
FIG. 6 is a partial side view of an alternate integrated circuit test system in accordance with a preferred embodiment of the present invention.

FIG. 6 shows an alternate embodiment of an integrated circuit test system in accordance with the present invention. Important distinctions between the embodiment shown in FIG. 6 and the embodiment shown in FIG. 5 are elastomeric pedestal 610, a floating force focusing member 616, and a shaped elastomer 612. More specifically, in the configuration shown in FIG. 6, elastomeric pedestal 610 has been placed between pressure applicator 614 and floating force focusing member 616. In the preferred embodiment, elastomeric pedestal 610 is a pad comprised of rubber or other similar material. Pedestal 610 allows floating force focusing member 616 to move, shifting its operating plane, to conform to any non-parallel plane variations of the semiconductor wafer 110.

Flexible circuit 214 is mounted over floating force focusing member 616 in the same manner as it is mounted over pressure applicator 212, discussed previously.

In the embodiment shown in FIG. 6, the surface area of the floating force focusing member 616 is made as small as practical, being large enough only to encompass the contacts of the semiconductor die under test (represented by contact balls 618). The floating force focusing member 616 contains a recessed cavity 620. Associated with floating force focusing member 616 is shaped elastomer 612 which is sized to fit on member 616. The shaped elastomer 612 transfers the focused force to the contact areas and provides compliance for varying contact heights of the die under test.

In addition, force focusing member 616 and associated shaped elastomer 612 may be employed in a variety of other configurations that do not require an elastomeric pedestal 610. Without the elastomeric pedestal 610 the floating force focusing member 616 would be an integral part of pressure applicator 614. According to the preferred embodiment, floating force focusing member 616 and associated shaped elastomer 612 are aligned to the contact balls 618 of the semiconductor die under test.

Floating force focusing member 616 and associated shaped elastomer 612 are recessed in locations where there are no contact balls or pads. Floating force focusing member 616 provides an isolated force which is aligned against the electrical contacts of the semiconductor die under test. If the force focusing feature were not provided, then a situation called the pillow effect would develop which is shown in FIG. 7.

Figure 7:
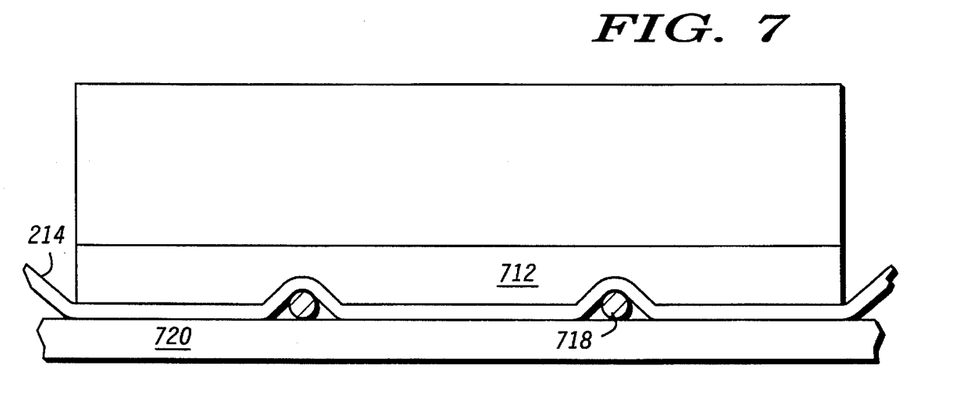
FIG. 7 is a partial side view of an alternate integrated circuit test system in which the pillow effect is demonstrated.

In FIG. 7 describing the pillow effect, note that the contact balls 718 press into the elastomer 712, thereby causing the elastomer to press flexible circuit 214 into contact with the surface of semiconductor die 720. At this point, any additional force applied is distributed across the full surface area of the semiconductor die 720 rather than exclusively to the die contact points. With the situation illustrated in FIG. 7, transferring sufficient force to the bumps 718 for reliable electrical contact becomes difficult. Furthermore, a large surface area of flexible circuit 214 comes in direct contact with the semiconductor die 720 collecting debris via the "dust mop" effect.

In FIG. 6, an alternative embodiment of the shaped elastomer 612 could be continuous from one side of the floating force focusing member 616 to the other side, not being shaped to conform to the footprint of the floating force focusing member 616. In this case, the force focusing feature is provided solely by the floating force focusing member, not by the elastomer.

In another embodiment, the benefit of compliance provided by the shaped elastomer 612 could instead be provided by an elastomeric surface on the top surface of flexible circuit 214 in association with floating force focusing member 616.

Floating force focusing member 616 in association with shaped elastomer 612 provides a recessed cavity 620 which allows flexible circuit 214 to flex away from the semiconductor die being tested. Note that such a cavity could be provided in a variety of configurations, and need not be restricted to configurations having floating pressure applicators or other specific features of the discussed embodiments.

With the recessed cavity 620 provided, it is possible to form the flexible circuit into the cavity and further insure against that part of the flexible circuit 214 touching the semiconductor wafer 110. This will also alleviate the debris tracking or "dust mop" effect by limiting the area of the flexible circuit 214 which is likely to touch the semiconductor wafer 110.

It should now be apparent the particular embodiments solve certain problems associated with the commercial membrane probe cards. Particular embodiments provide: 1) a quick change flexible circuit membrane; 2) a quadrant based flexible circuit membrane design which allows steep launch angles away from a rectangular die under test; 3) edge guided flexible circuit membrane positioning for concentric alignment in probe tooling fixture; 4) a method of focusing force only at the test point locations in line with the die pad contact positions which allows greater force to be concentrated on the contact area, and helps to alleviate the debris tracking or "dust mop" effect; and 5) a relieved area on the pressure applicator to prevent membrane droop or the pillowing effects.

We claim:

1. An integrated circuit test system, comprising:

a semiconductor die including a plurality of die electrical contacts;

a plurality of external electrical contacts corresponding to the die electrical contacts;

a force focusing member exerting an isolated force against the external electrical contacts, the isolated force being aligned with the die electrical contacts, wherein the force focusing member comprises an elastomeric pressure pad configured to have pad portions aligned with the die electrical contacts; and a rigid force applicator and an elastomeric pedestal, the elastomeric pedestal located between the rigid force applicator and a rigid portion of the force focusing member, the elastomeric pedestal allowing the force focusing member to adjust to a position occupying a plane parallel with the semiconductor die.

2. An integrated circuit test system, comprising:

a semiconductor die including a plurality of die electrical contacts;

a plurality of external electrical contacts corresponding to the die electrical contacts;

a force focusing member exerting an isolated force against the external electrical contacts, the isolated force being aligned with the die electrical contacts; and a rigid force applicator and an elastomeric pedestal, the elastomeric pedestal located between the rigid force applicator and a rigid portion of the force focusing member, the elastomeric pedestal allowing the force focusing member to adjust to a position occupying a plane parallel with the semiconductor die, wherein the force focusing member lies between the rigid force applicator and the semiconductor die, and wherein the external electrical contacts are disposed on a flexible membrane positioned between the force focusing member and the semiconductor die, and wherein a portion of the flexible membrane is recessed toward the force applicator and away from the semiconductor die.

* * * * *